United States Patent
Hazani

(10) Patent No.: US 12,126,168 B2
(45) Date of Patent: Oct. 22, 2024

(54) POWER DISTRIBUTION WITHIN A POWER SOURCE UNIT

(71) Applicant: Corning Research & Development Corporation, Corning, NY (US)

(72) Inventor: Ami Hazani, Raanana (IL)

(73) Assignee: CORNING RESEARCH & DEVELOPMENT CORPORATION, Corning, NY (US)

(*) Notice: Subject to any disclaimer, the term of this patent is extended or adjusted under 35 U.S.C. 154(b) by 129 days.

(21) Appl. No.: 17/679,851

(22) Filed: Feb. 24, 2022

(65) Prior Publication Data
US 2023/0170734 A1    Jun. 1, 2023

Related U.S. Application Data

(60) Provisional application No. 63/284,035, filed on Nov. 30, 2021.

(51) Int. Cl.
*H04B 10/00* (2013.01)
*H02J 13/00* (2006.01)
(Continued)

(52) U.S. Cl.
CPC .. *H02J 13/00019* (2020.01); *H02J 13/00022* (2020.01); *H04B 10/272* (2013.01); *H02J 2213/10* (2020.01); *H05K 1/028* (2013.01)

(58) Field of Classification Search
CPC .. H04B 10/806; H04B 10/807; H04B 10/808; H04B 10/272; H04B 10/27; H04B 10/40; H04B 10/2575; H04B 10/25752; H04B 10/25753; H04B 10/25758; H02J 13/00022; H02J 13/0003

USPC ... 398/115, 116, 117, 66, 67, 68, 69, 70, 71, 398/72, 135, 136, 158, 159, 171, 164, 398/137, 138, 139; 361/760, 683, 719

See application file for complete search history.

(56) References Cited

U.S. PATENT DOCUMENTS

| | | | |
|---|---|---|---|
| 5,774,316 | A | 6/1998 | McGary et al. |
| 6,584,197 | B1 | 6/2003 | Boudreaux et al. |

(Continued)

FOREIGN PATENT DOCUMENTS

| | | |
|---|---|---|
| EP | 1347607 A1 | 9/2003 |
| WO | 2004/093283 A1 | 10/2004 |

(Continued)

OTHER PUBLICATIONS

International Search Report and Written Opinion of the International Searching Authority; PCT/IL2018/050368; Mailed Jul. 13, 2018; 12 Pages; European Patent Office.

(Continued)

*Primary Examiner* — Hanh Phan
(74) *Attorney, Agent, or Firm* — William D. Doyle

(57) ABSTRACT

Systems for power distribution within a power source unit are well suited for use in power source units that work with power distribution networks such as may be found associated with wireless communication systems or the like. More specifically, exemplary aspects provide a flexible power cable that extends from a powering supply to printed circuit boards (PCBs) on which output power ports are located. The PCBs may be arranged in a cascaded or daisy chain topology or in a star topology relative to the powering supply.

16 Claims, 12 Drawing Sheets

(51) Int. Cl.
  *H04B 10/272* (2013.01)
  *H05K 1/02* (2006.01)

(56) References Cited

U.S. PATENT DOCUMENTS

| | | | |
|---|---|---|---|
| 7,187,556 B2 * | 3/2007 | Barr | H01R 12/594 |
| | | | 361/679.02 |
| 7,545,055 B2 | 6/2009 | Barrass | |
| 8,165,471 B2 * | 4/2012 | Theodoras, II | H04L 49/40 |
| | | | 398/139 |
| 8,559,150 B2 | 10/2013 | Veroni | |
| 8,605,394 B2 | 12/2013 | Crookham et al. | |
| 8,781,637 B2 | 7/2014 | Eaves | |
| 9,042,732 B2 | 5/2015 | Cune et al. | |
| 9,240,835 B2 | 1/2016 | Berlin et al. | |
| 9,325,429 B2 | 4/2016 | Berlin et al. | |
| 9,497,706 B2 | 11/2016 | Atias et al. | |
| 9,532,329 B2 | 12/2016 | Sauer | |
| 9,673,904 B2 | 6/2017 | Palanisamy et al. | |
| 9,685,782 B2 | 6/2017 | Blackwell et al. | |
| 9,865,782 B2 | 1/2018 | Chiu et al. | |
| 10,020,885 B2 | 7/2018 | Mizrahi et al. | |
| 10,257,056 B2 | 4/2019 | Hazani et al. | |
| 10,404,099 B1 * | 9/2019 | Bonja | H02J 3/00 |
| 10,405,356 B2 | 9/2019 | Hazani et al. | |
| 11,249,266 B2 * | 2/2022 | Mazzini | H04B 10/801 |
| 2003/0178979 A1 | 9/2003 | Cohen | |
| 2006/0232134 A1 | 10/2006 | Kirkorian | |
| 2011/0007443 A1 | 1/2011 | Crookham et al. | |
| 2011/0268446 A1 | 11/2011 | Cune et al. | |
| 2013/0033106 A1 | 2/2013 | Schindler et al. | |
| 2013/0163996 A1 * | 6/2013 | Kagaya | H01P 1/20345 |
| | | | 333/12 |
| 2013/0249292 A1 | 9/2013 | Blackwell et al. | |
| 2014/0146692 A1 | 5/2014 | Hazani et al. | |
| 2014/0243033 A1 | 8/2014 | Wala et al. | |
| 2014/0308044 A1 | 10/2014 | Heidler et al. | |
| 2015/0077130 A1 | 3/2015 | Hackl | |
| 2015/0207318 A1 | 7/2015 | Lowe et al. | |
| 2015/0215001 A1 | 7/2015 | Eaves | |
| 2015/0350756 A1 | 12/2015 | Cune et al. | |
| 2016/0282894 A1 | 9/2016 | Hazani et al. | |
| 2016/0352393 A1 | 12/2016 | Berlin et al. | |
| 2017/0025842 A1 | 1/2017 | Peterson | |
| 2017/0054496 A1 | 2/2017 | Hazani | |
| 2017/0070975 A1 | 3/2017 | Ranson et al. | |
| 2018/0048140 A1 | 2/2018 | Takuma et al. | |
| 2018/0351633 A1 | 12/2018 | Birkmeir et al. | |
| 2019/0199448 A1 * | 6/2019 | Sipes, Jr. | G02B 6/3817 |

FOREIGN PATENT DOCUMENTS

| | | |
|---|---|---|
| WO | 2012/071367 A1 | 5/2012 |
| WO | 2016/176314 A1 | 11/2016 |

OTHER PUBLICATIONS

Non-Final Office Action for U.S. Appl. No. 16/203,520, mailed Nov. 21, 2019, 16 pages.

Notice of Allowance for U.S. Appl. No. 16/203,520, mailed Jan. 21, 2020, 13 pages.

* cited by examiner

POWER DISTRIBUTION WITHIN A POWER SOURCE UNIT

CROSS-REFERENCE TO RELATED APPLICATIONS

This application claims the benefit of priority under 35 U.S.C. § 119 of U.S. Provisional Application No. 63/284,035, filed Nov. 30, 2021, the content of which is relied upon and incorporated herein by reference in its entirety.

BACKGROUND

The technology of the disclosure relates to a power source unit and, more particularly, for a power source unit in a power distribution network (PDN).

Electrical devices require power. In many instances, the power may be provided by a battery or a local power source such as a wall outlet or the like. However, in some instances, it may be inconvenient to supply power through a wall outlet or a battery. For example, the power demands or voltage levels of the device being powered may exceed that which is available through the conventional wall outlets (e.g., the item may need 340 Volts (V) instead of the conventional 110 V supplied by most US power outlets). Or, the device may consume sufficient power that battery supplies are impractical. Likewise, the location may be such that a local power supply is not available. In such instances, there may be a dedicated PDN associated with such devices.

A few exemplary systems that may have associated PDNs include, but are not limited to, server farms, lighting systems, and distributed communication systems (DCSs) such as a distributed antenna system (DAS) or radio access network (RAN). Such systems may have a central power source and one or more power conductors that convey power from the power source to one or more remote sub-units (e.g., a server, a lighting fixture, a remote antenna unit, or the like). There is a concern that a human may come into contact with the power conductors and be shocked or electrocuted by such contact. Accordingly, some regulations, such as International Electric Code (IEC) 60950-21, may limit the amount of direct current (DC) that is remotely delivered by the power source over the conductors to less than the amount needed to power the remote sub-unit during peak power consumption periods for safety reasons.

One solution to remote power distribution limitations is to employ multiple conductors and split current from the power source over the multiple conductors, such that the power on any one electrical conductor is below the regulated limit. The presence of multiple conductors places a burden on a power source for the PDN in that the power source must provide connection points for the multiple connectors. Accordingly, the power source or power source unit must have an effective and cost-effective mechanism through which power may be provided to each of the connection points.

No admission is made that any reference cited herein constitutes prior art. Applicant expressly reserves the right to challenge the accuracy and pertinency of any cited documents.

SUMMARY

Embodiments disclosed herein include systems and methods for power distribution within a power source unit (PSU). In particular, exemplary aspects are well suited for use in PSUs that work with power distribution networks (PDNs) such as may be found associated with wireless communication systems or the like. While PSUs are specifically contemplated, exemplary aspects may be useful for any electronic equipment that requires internal high current distribution with low cost/high density solution, for internal or for external power consumption needs. More specifically, exemplary aspects provide a flexible power cable that extends from a powering supply to printed circuit boards (PCBs) on which output power ports are located. The PCBs may be arranged in a cascaded or daisy chain topology or in a star topology relative to the powering supply. The flexible power cable consumes relatively little space within the housing of the PSU and allows for tight bends because of a low turning radius. Additionally, the flexible power cable is relatively easy to install, requiring only a bolt and optionally a nut. As still a further benefit, the cost of such flexible power cables is sufficiently low to be competitive against conventional solutions.

In this regard, in one embodiment, a PSU is disclosed. The PSU comprises a powering supply. The PSU also comprises a flexible cable coupled to the powering supply. The PSU also comprises a PCB coupled to the flexible cable such that the flexible cable may carry power from the powering supply to the PCB.

In another embodiment, a distributed communication system (DCS) is disclosed. The DCS comprises a PDN. The PDN comprises a PSU. The PSU comprises a powering supply. The PSU also comprises a flexible cable coupled to the powering supply. The PSU also comprises a PCB coupled to the flexible cable such that the flexible cable may carry power from the powering supply to the PCB. The DCS also comprises a plurality of remote sub-units. Each remote sub-unit comprises a remote sub-unit power input port coupled to the PSU. Each remote sub-unit also comprises a central unit. The central unit is configured to distribute received one or more downlink communications signals over one or more downlink communications links to one or more remote sub-units. The central unit is also configured to distribute received one or more uplink communications signals from the one or more remote sub-units from one or more uplink communications links to one or more source communications outputs. Each remote sub-unit among the plurality of remote sub-units is configured to distribute the received one or more downlink communications signals received from the one or more downlink communications links to one or more client devices. Each remote sub-unit among the plurality of remote sub-units is also configured to distribute the received one or more uplink communications signals from the one or more client devices to the one or more uplink communications links.

Additional features and advantages will be set forth in the detailed description which follows and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding of the disclosure, and are incorporated in and constitute a part of this specification. The drawings illustrate one or more embodiment(s), and together with the description serve to explain principles and operation of the various embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include systems and methods for power distribution within a power source unit (PSU). In particular, exemplary aspects are well suited for use in PSUs that work with power distribution networks (PDNs) such as may be found associated with wireless communication systems (WCS) or the like. While PSUs are specifically contemplated, exemplary aspects may be useful for any electronic equipment that requires internal high current distribution with low cost/high density solution, for internal or for external power consumption needs. More specifically, exemplary aspects provide a flexible power cable that extends from a powering supply to printed circuit boards (PCBs) on which output power ports are located. The PCBs may be arranged in a cascaded or daisy chain topology or in a star topology relative to the powering supply. The flexible power cable consumes relatively little space within the housing of the PSU and allows for tight bends because of a low turning radius. Additionally, the flexible power cable is relatively easy to install, requiring only a bolt and optionally a nut. As still a further benefit, the cost of such flexible power cables is sufficiently low to be competitive against conventional solutions.

While the present disclosure applied to more than a PSU, for ease of discussion, the present disclosure will focus on a PSU in a PDN. A PDN rarely exists in isolation. Rather, a PDN provides infrastructure to some other system, a few of which are briefly discussed with reference to FIGS. 1-3. A discussion of a PSU for use with any type of PDN begins below with reference to FIG. 4A and a discussion of the flexible cable used within a PSU begins below with reference to FIG. 7A.

Figure 1:
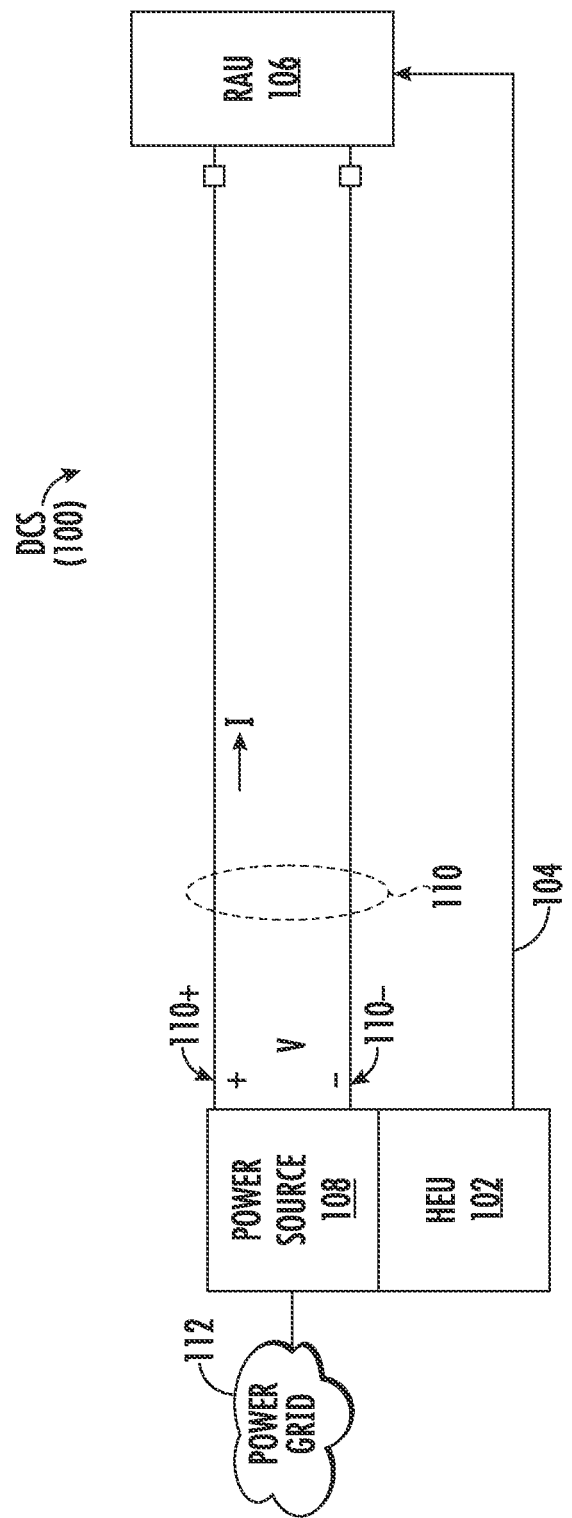
FIG. 1 is a schematic diagram of an exemplary power distribution network (PDN) for a distributed communication system (DCS), where the PDN may have start-up protocols according to exemplary aspects of the present disclosure.

In this regard, FIG. 1 illustrates a simplified block diagram of a distributed communication system (DCS) 100. The DCS 100 may include a head end unit (HEU) 102 that communicates through a communication medium 104 with a remote antenna unit (RAU) 106. The communication medium 104 may be a wire-based or optical fiber medium. The RAU 106 includes a transceiver and an antenna (not illustrated) that communicate wirelessly with mobile terminals and other user equipment (also not illustrated). Because the RAU 106 sends and receives wireless signals and may potentially perform other functions, the RAU 106 consumes power. That power may, in some instances, be provided locally. More commonly, and of interest to the present disclosure, the DCS 100 includes a PDN, and the RAU 106 receives power from a power source or PSU 108 that transmits power to the RAU 106 over power lines 110 formed from a positive power line 110+ and a negative power line 110−. The power lines 110 may be many meters long, for example, extending through an office building, across multiple floors of a multi-story building, or the like. Further, the power lines 110 may couple to multiple RAUs 106 (even though only one is illustrated in FIG. 1). The PSU 108 may be coupled to an external power grid 112.

Figure 2:
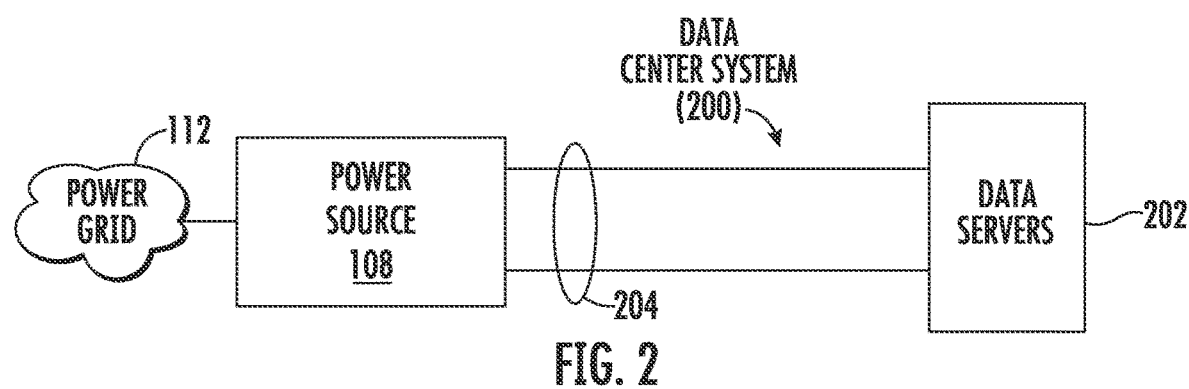
FIG. 2 is a schematic diagram of an exemplary PDN for a server farm, where the PDN may have start-up protocols according to exemplary aspects of the present disclosure.

Similarly, FIG. 2 illustrates a data center system 200 having a PSU 108 coupled to remote data servers 202 through power lines 204. The PSU 108 is coupled to the external power grid 112. As with the RAU 106, the data servers 202 may consume power supplied through the power lines 204.

Figure 3:
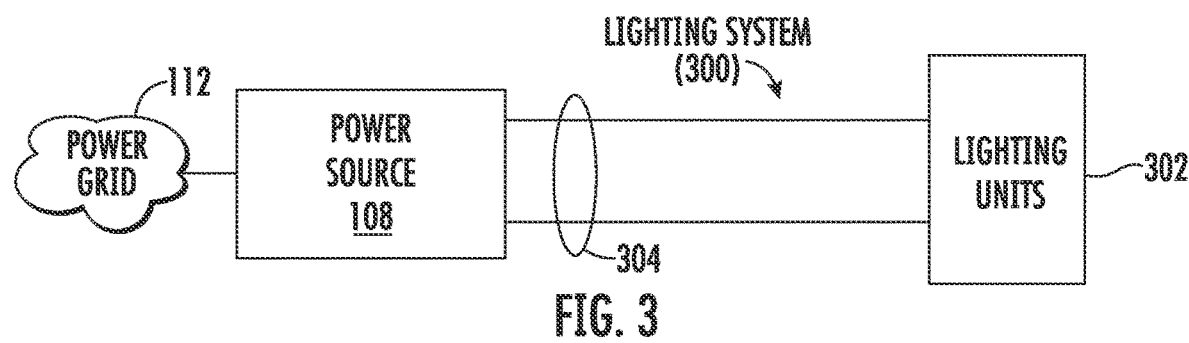
FIG. 3 is a schematic diagram of an exemplary PDN for a lighting system, where the PDN may have start-up protocols according to exemplary aspects of the present disclosure.

Similarly, FIG. 3 illustrates a lighting system 300 having a PSU 108 coupled to remote lighting units 302 through power lines 304. The power source 108 is coupled to the external power grid 112. As with the RAU 106, the remote lighting units 302 may consume power supplied through the power lines 304.

It should be appreciated that there may be other contexts that may use a PDN, and the examples provided in FIGS. 1-3 are not intended to be limiting. As a note of nomenclature, the RAU 106, the remote data servers 202, and the lighting units 302 are remote sub-units.

Figure 4A:
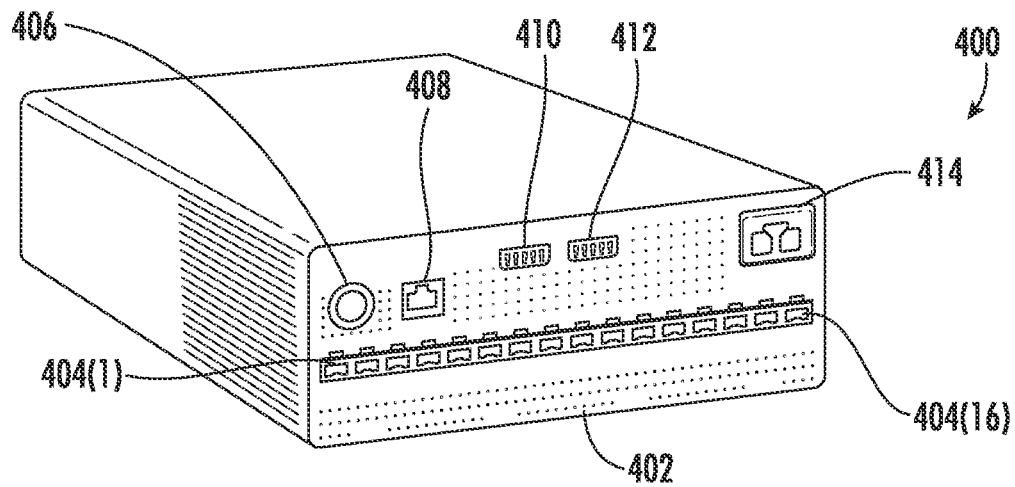
FIG. 4A is a side elevational view of a power source unit (PSU) illustrating a first number of power ports available for use in a PDN.
Figure 4B:
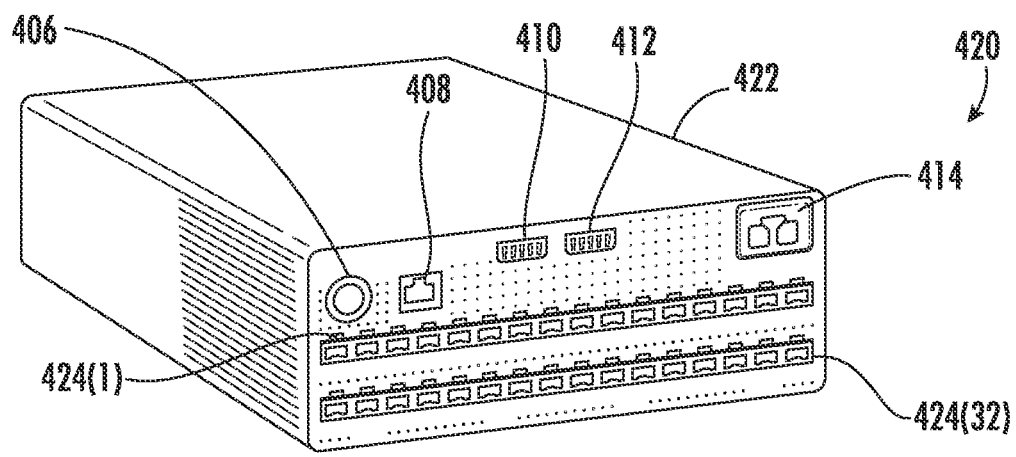
FIG. 4B is a side elevational view of a PSU illustrating a second number of power ports available for use in a PDN.

The PSU may be provided in a housing or cabinet such as those illustrated in FIGS. 4A and 4B. Specifically, FIG. 4A illustrates a PSU 400 that has a cabinet 402 that is generally rectilinear in nature and has sixteen (16) power output ports 404(1)-404(16). Additionally, the PSU 400 may include an output disable/enable toggle pushbutton 406, an external management option port 408, an RS485 port 410, an alarm port 412, a power input port 414, which may couple to a high voltage output, or the like. PSU 420 in FIG. 4B is substantially similar, but a cabinet 422 has thirty-two power output ports 424(1)-424(32).

Commercial pressure dictates that the form factor of the cabinets 402 and 422 be as small as practical. Each power output port 404(1)-404(16) or 424(1)-424(32) generally requires a dedicated PCB with circuitry ancillary to the function of the power output port 404(1)-404(16) or 424(1)-424(32). Further, each power output port 404(1)-404(16) or 424(1)-424(32) may be configured to supply 100 watts (100 W) of power. Thus, conventional approaches to power distribution from the power input port 414 to the PCBs associated with the power output ports 404(1)-404(16) and 424(1)-424(32) may be expensive or consume relatively large amounts of space. For example, a round wire of sufficient gauge to handle the currents of interest may have relatively expensive connectors and relatively large bending radii. The connectors add to the overall expense of the product and the large bending radii causes such wires to consume large amounts of real estate within the cabinets.

Figure 5:
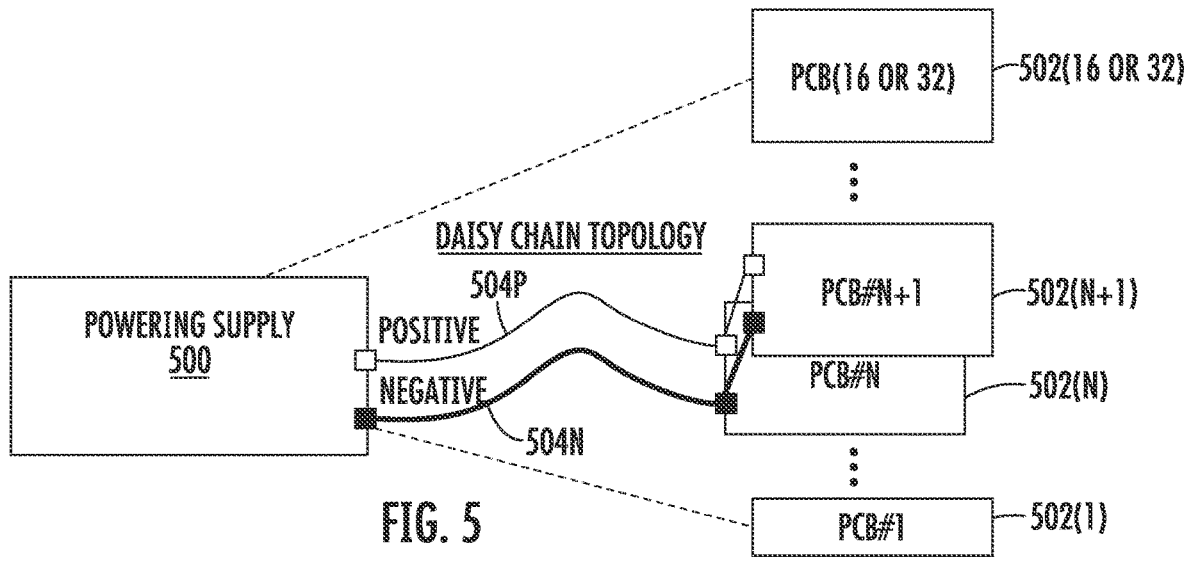
FIG. 5 is a block diagram of a PSU containing a plurality of printed circuit boards (PCBs) each having a power port, where the PCBs are coupled to a powering supply in a cascaded or daisy-chain configuration or topology using a flexible cable according to exemplary aspects of the present disclosure.
Figure 6:
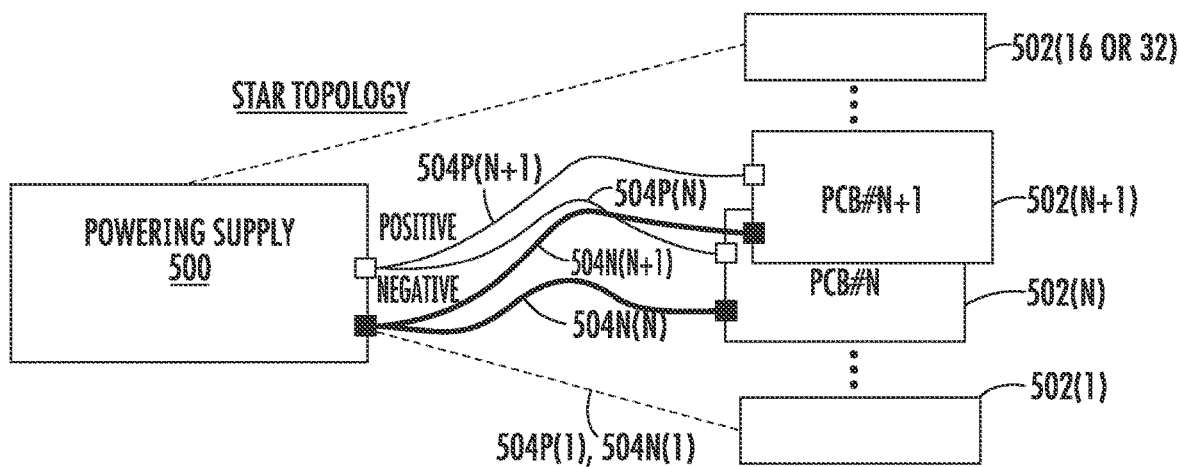
FIG. 6 is a block diagram of a PSU containing a plurality of PCBs each having a power port, where the PCBs are coupled to a powering supply in a star configuration or topology using a flex cable according to exemplary aspects of the present disclosure.

Such arrangements may be further complicated based on topologies within the cabinets 402 or 422. Specifically, PCBs may be arranged in a cascaded or daisy chain topology relative to a powering supply as illustrated in FIG. 5 or a star topology as illustrated in FIG. 6. In this regard, FIG. 5 illustrates a powering supply 500 that may be coupled to the power input port 414 of FIG. 4A or 4B and is coupled to PCBs 502(1)-502(16 or 32) through a positive wire 504P and a negative wire 504N. As illustrated, PCB 502(N) is coupled to PCB 502(N+1) in a cascaded or daisy chain configuration.

In contrast, as illustrated in FIG. 6, each PCB 502(1)-502(16 or 32) may be coupled to the powering supply 500 in a star or direct topology through positive wires 504P(1)-504P(16 or 32) and negative wires 504N(1)-504N(16 or 32).

In an exemplary aspect, the positive wire 504P and the negative wire 504N are designed to be capable of handling voltages in excess of twenty volts (20 V) (e.g., 24 V or 56 V) and greater than one hundred amps of current (100 A) and more specifically capable of handling 150 A of current with an additional safety margin. The wires 504P, 504N are also designed to have a small bending radius and be relatively easy to couple to the powering supply 500 and the PCBs 502(1)-502(16 or 32). A cable that meets all of these requirements is more commonly used as a grounding cable and is sometimes referred to as a flexible grounding cable comparable to the T&B FB2G12 Flexible Braid cable sold by Tomas and Betts. The cable is generally flat with many individual conductive strands (e.g., copper or aluminum are common, gold or silver also work, but expense makes impractical) and are defined by cross-sectional area. Given the 150 A requirement (with appropriate safety margin), an exemplary cross-section is 16 square millimeters ($mm^2$). If there are different current requirements, a different cross-sectional area may be used. In a further exemplary aspect, the cable may be sheathed in a red or black insulative material (e.g., rubber or a polymer) to assist in installation (e.g., red for a positive line and black for a negative line).

Figure 7A:
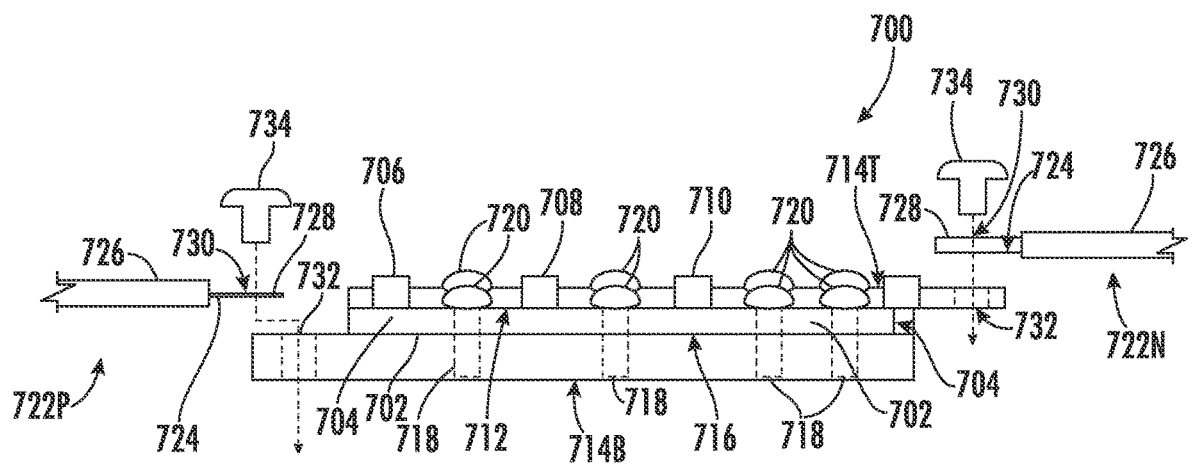
FIG. 7A is a side elevational view of a PCB from the PSU of FIG. 5 or 6 showing how the flexible cable may be coupled to the PCB.
Figure 7B:
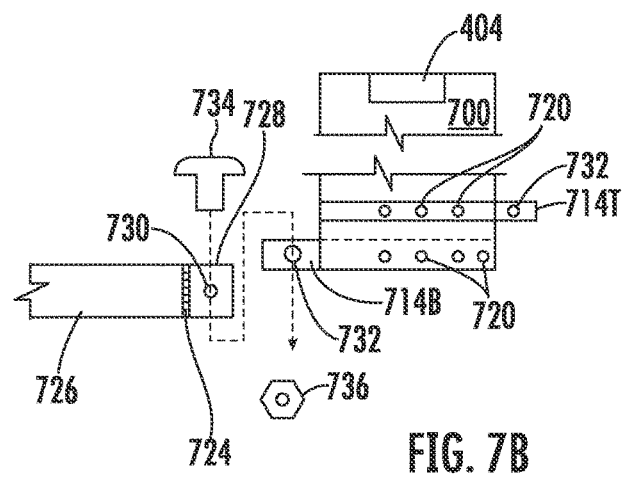
FIG. 7B is top plan view of the PCB from the PSU of FIG. 5 or 6 showing how the flexible cable may be coupled to the PCB.

Use and installation of such an exemplary flexible cable is illustrated in more detail with reference to FIGS. 7A-9. In particular, FIGS. 7A and 7B illustrate a PCB 700 that has metal layers 702 and vertical interconnects 704 therein as is common in PCBs. Active elements 706, reactive elements such as inductors 708 or capacitors 710, and a power port 404 (FIG. 7B), may be present on a top surface 712 of the PCB 700. Two metal bars 714T and 714B may be attached to the PCB 700 on the top surface 712 and a bottom surface 716, respectively. The metal bars 714T, 714B may be for example, aluminum or copper and/or tin plated if desired. The metal bars 714T, 714B may include threaded apertures 718 through which bolts 720 may be used to secure the metal bars 714T, 714B to the PCB 700. The PCB 700 may include a metal layer (not shown) that is coupled to one or more vertical interconnects 704 to convey power through the PCB 700 to elements on the PCB 700 and to the power port 404. As noted above, flexible cables 722P, 722N may include a braided or loose metal mesh 724 that acts as a conductive material. The majority of the metal mesh 724 may be contained within an insulative sheath 726. The metal mesh 724 may be coupled to a solid metal tongue 728 having an aperture 730 therein. The aperture 730 may be threaded but need not be. During installation, the aperture 730 is aligned with an aperture 732 at the end of the metal bars 714T, 714B and a bolt 734 used to secure the metal tongue 728 to the metal bar 714T, 714B. Optionally, a nut 736 may be used with the bolt 734. After attachment, the metal tongue 728 lies flush against and abuts the metal bar 714T, 714B. In an exemplary aspect, a positive flexible cable 722P is coupled to the metal bar 714B, and a negative flexible cable 722N is coupled to the metal bar 714T, although this may be reversed if needed or desired. It should be appreciated that multiple metal tongues 728 may be concurrently secured to the metal bar 714T, 714B to assist in the creation of cascaded or daisy chain topologies (e.g., FIG. 5).

Figure 8A:
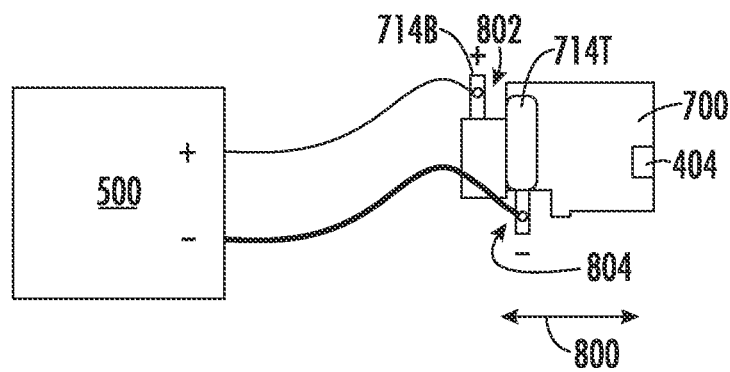
FIG. 8A shows a top plan view of the PCB of FIG. 7A coupled to a powering supply.
Figure 8B:
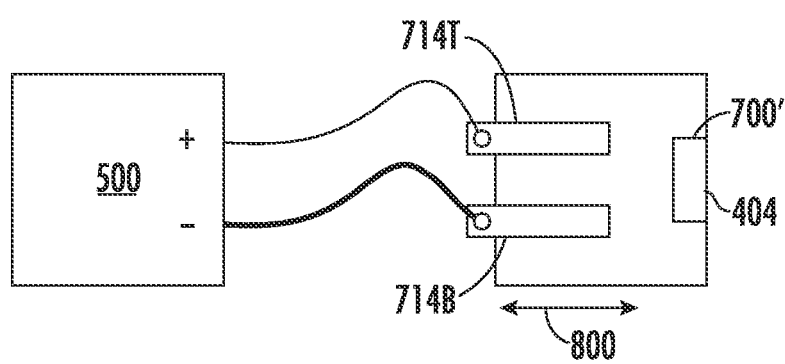
FIG. 8B shows a top plan view of an alternate arrangement for a PCB coupled to a powering supply.

In an exemplary aspect, illustrated in FIG. 8A, the metal bars 714T and 714T are perpendicular to an axis 800 of the PCB 700, and the PCB 700 may include cutouts 802, 804 that allow the metal bars 714T, 714B to have apertures 732 exposed to assist in securing the metal tongue 728 thereto without changing the overall footprint of the PCB 700. Alternatively, as illustrated in FIG. 8B, both bars 714T, 714B may be on the same side of the PCB 700 and extend parallel to the axis 800 and extend away from the power output port 404.

Figure 9:
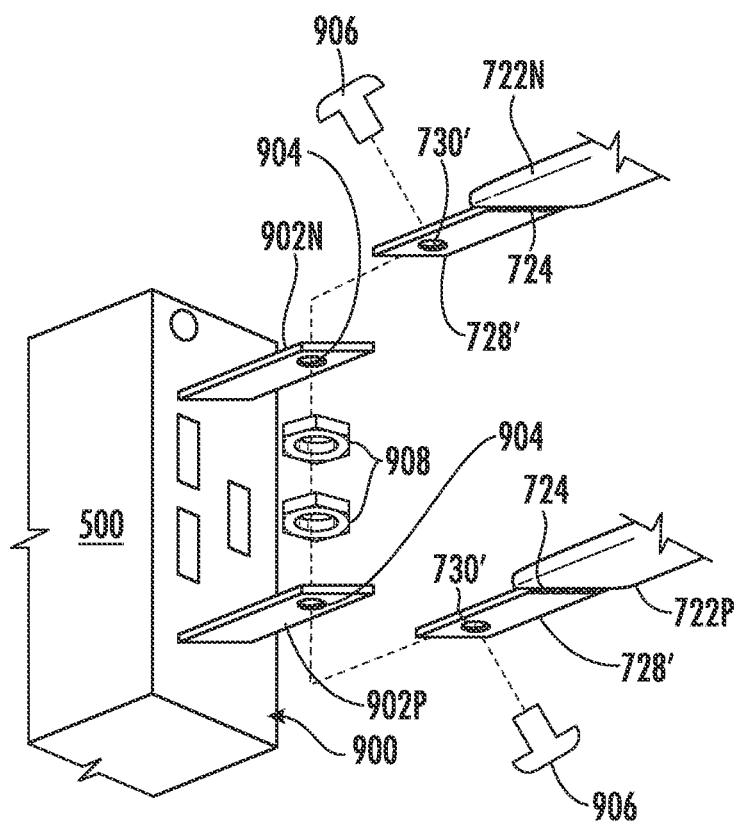
FIG. 9 shows a perspective view of the powering supply from the PSU of FIG. 5 or 6 showing how the flexible cable may be coupled to the powering supply.

FIG. 9 illustrates connection of the flexible cables 722P, 722N to the powering supply 500. In particular, the powering supply 500 may have a surface or face 900 that has tongues 902N, 902P extending therefrom. Each tongue 902N, 902P includes a respective aperture 904. A respective aperture 730' on a respective tongue 728' of the flexible cables 722P, 722N, align with the apertures 904 and may be secured thereto with bolts 906 and nuts 908. After attachment, the tongues 902N, 902P lie flush against and abut the tongues 728'. Again, the simple bolt-nut attachment makes installation relatively quick and simple. The flexible cables 722P, 722N may then be routed within the cabinet 402 easily, preserving a small footprint for the cabinet 402 while also accommodating the high power requirements.

Note that while bolt and nuts are used throughout to fasten the flexible cable to the metal bar or metal tongue, it should be appreciated that other fasteners could be used. Likewise, soldering or welding may be used, although such increases the complexity of installation.

Figure 13:
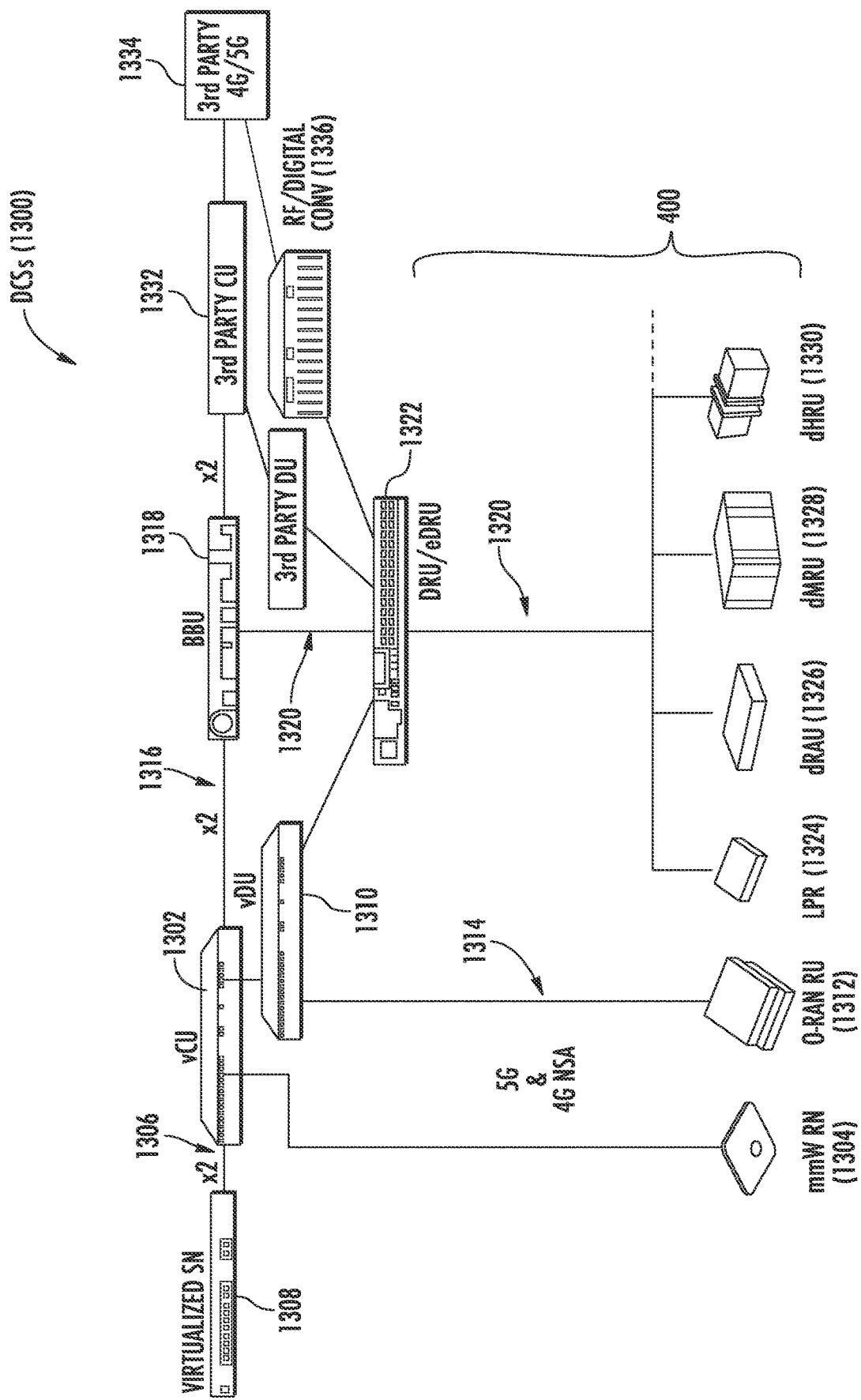
FIG. 13 is a schematic diagram an exemplary DCS that supports 4G and 5G communications services, and that can include one or more PDNs, including the PDNs in FIG. 5 or 9.
Figure 14:
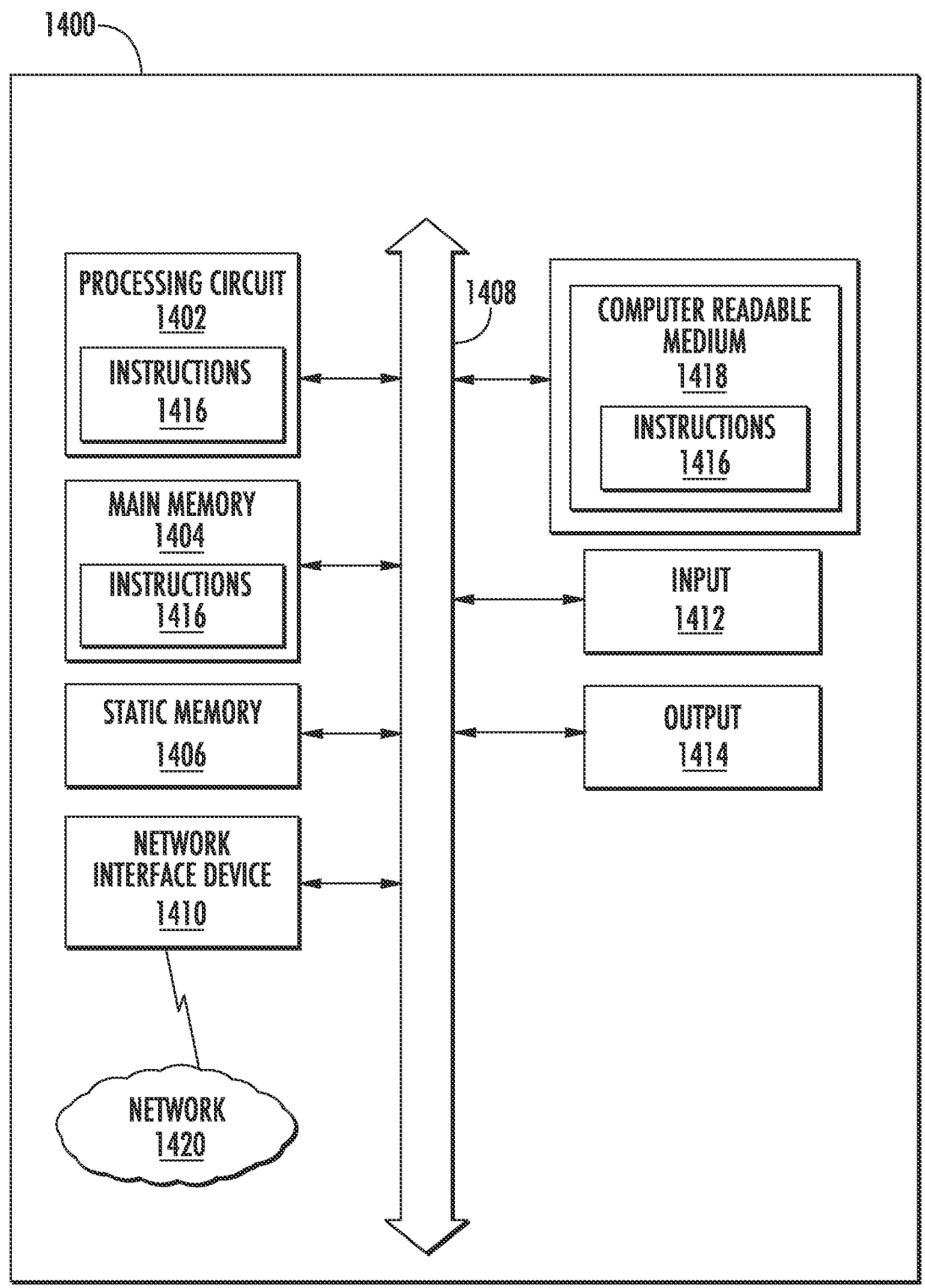
FIG. 14 is a schematic diagram of a generalized representation of an exemplary controller that can be included in any component or circuit in a power distribution system, including the PDNs in FIG. 5 or 9, wherein an exemplary computer system is adapted to execute instructions from an exemplary computer-readable link.

In the interests of completeness, one exemplary DCS having a power distribution network is explored below with reference to FIGS. 10-13 and an exemplary computer that may be used at various locations within a PDN is illustrated in FIG. 14. It should be appreciated that the precise context for the PDN is not central to the present disclosure.

Figure 10:
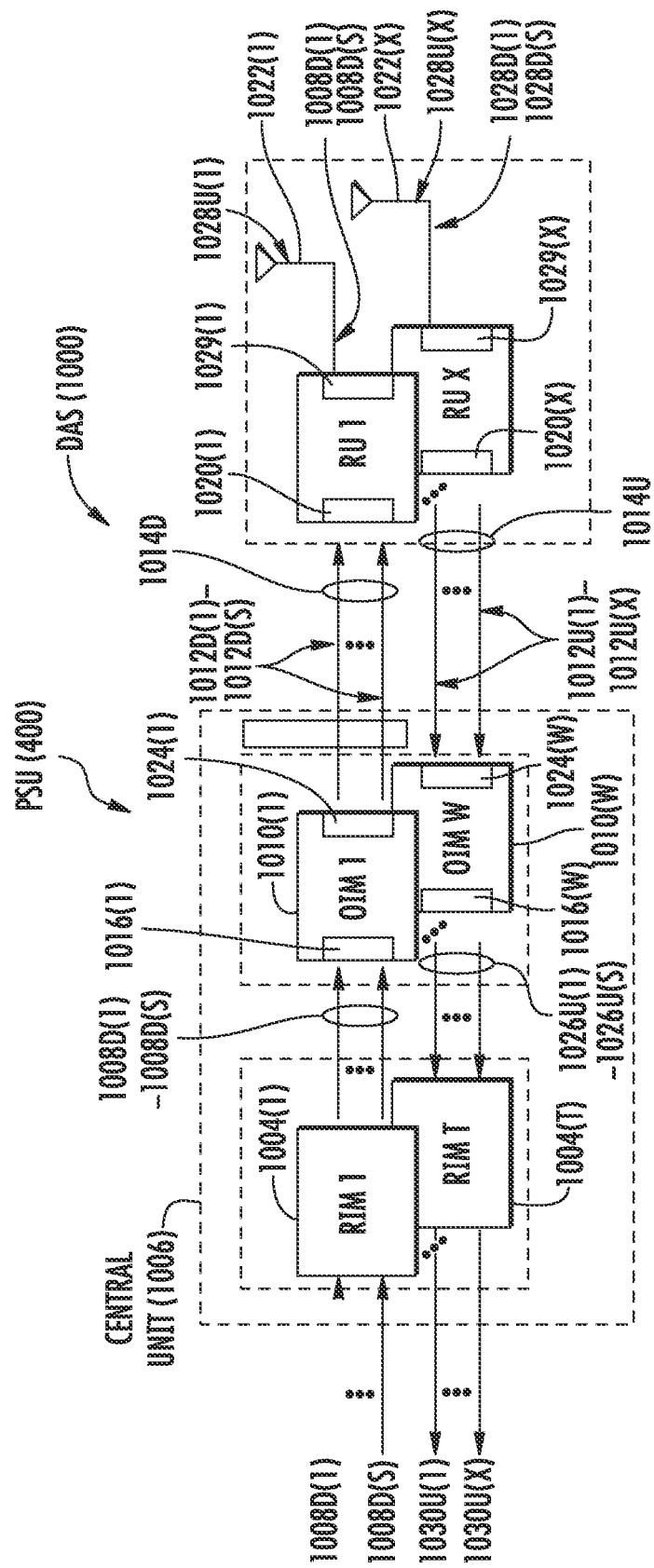
FIG. 10 is a schematic diagram of an exemplary optical fiber-based DCS configured to distribute communications signals between a central unit and a plurality of remote sub-units, and that can include one or more PDNs using the PSU of the present disclosure.

FIG. 10 is a schematic diagram of an exemplary optical fiber-based distributed antenna system (DAS) 1000 in which a PDN having the PSU 400 can be provided. A DAS is a system that is configured to distribute communications signals, including wireless communications signals, from a central unit to a plurality of remote sub-units over physical communications media, to then be distributed from the remote sub-units wirelessly to client devices in wireless communication range of a remote unit. The DAS 1000 in this example is an optical fiber-based DAS that is comprised of three (3) main components. One or more radio interface circuits provided in the form of radio interface modules (RIMs) 1004(1)-1004(T) are provided in a central unit 1006 to receive and process downlink electrical communications signals 1008D(1)-1008D(S) prior to optical conversion into downlink optical communications signals. The downlink electrical communications signals 1008D(1)-1008D(S) may be received from a base transceiver station (BTS) or baseband unit (BBU) as examples. The downlink electrical communications signals 1008D(1)-1008D(S) may be analog signals or digital signals that can be sampled and processed as digital information. The RIMs 1004(1)-1004(T) provide both downlink and uplink interfaces for signal processing. The notations "1-S" and "1-T" indicate that any number of the referenced component, 1-S and 1-T, respectively, may be provided.

With continuing reference to FIG. 10, the central unit 1006 is configured to accept the plurality of RIMs 1004(1)-1004(T) as modular components that can easily be installed and removed or replaced in a chassis. In one embodiment, the central unit 1006 is configured to support up to twelve (12) RIMs 1004(1)-1004(12). Each RIM 1004(1)-1004(T) can be designed to support a particular type of radio source or range of radio sources (i.e., frequencies) to provide flexibility in configuring the central unit 1006 and the DAS 1000 to support the desired radio sources. For example, one RIM 1004(1)-1004(T) may be configured to support the Personal Communication Services (PCS) radio band. Another RIM 1004(1)-1004(T) may be configured to support the 700 MHz radio band. In this example, by inclusion of these RIMs 1004(1)-1004(T), the central unit 1006 could be configured to support and distribute communications signals, including those for the communications services and communications bands described above as examples.

The RIMs 1004(1)-1004(T) may be provided in the central unit 1006 that support any frequencies desired, including, but not limited to, licensed US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 10, the received downlink electrical communications signals 1008D(1)-1008D(S) are provided to a plurality of optical interfaces provided in the form of optical interface modules (OIMs) 1010(1)-1010(W) in this embodiment to convert the downlink electrical communications signals 1008D(1)-1008D(S) into downlink optical communications signals 1012D(1)-1012D(S). The notation "1-W" indicates that any number of the referenced component 1-W may be provided. The OIMs 1010(1)-1010(W) may include one or more optical interface components (OICs) that contain electrical-to-optical (E-O) converters 1016(1)-1016(W) to convert the received downlink electrical communications signals 1008D(1)-1008D(S) into the downlink optical communications signals 1012D(1)-1012D(S). The OIMs 1010(1)-1010(W) support the radio bands that can be provided by the RIMs 1004(1)-1004(T), including the examples previously described above. The downlink optical communications signals 1012D(1)-1012D(S) are communicated over a downlink optical fiber communications link 1014D to a plurality of remote sub-units (e.g., remote sub-units 504, 904) provided in the form of remote sub-units in this example. One or more of the downlink optical communications signals 1012D(1)-1012D(S) can be distributed to each remote sub-unit. Thus, the distribution of the downlink optical communications signals 1012D(1)-1012D(S) from the central unit 1006 to the remote sub-units is in a point-to-multipoint configuration in this example.

With continuing reference to FIG. 10, the remote sub-units include optical-to-electrical (O-E) converters 1020(1)-1020(X) configured to convert the one or more received downlink optical communications signals 1012D(1)-1012D(S) back into the downlink electrical communications signals 1008D(1)-1008D(S) to be wirelessly radiated through antennas 1022(1)-1022(X) in the remote sub-units to user equipment (not shown) in the reception range of the antennas 1022(1)-1022(X). The notation "1-X" indicates that any number of the referenced component 1-X may be provided. The OIMs 1010(1)-1010(W) may also include O-E converters 1024(1)-1024(W) to convert received uplink optical communications signals 1012U(1)-1012U(X) from the remote sub-units into uplink electrical communications signals 1026U(1)-1026U(S) as will be described in more detail below.

With continuing reference to FIG. 10, the remote sub-units are also configured to receive uplink electrical communications signals 1028U(1)-1028U(X) received by the respective antennas 1022(1)-1022(X) from client devices in wireless communication range of the remote sub-units. The uplink electrical communications signals 1028U(1)-1028U (S) may be analog signals or digital signals that can be sampled and processed as digital information. The remote sub-units include E-O converters 1029(1)-1029(X) to convert the received uplink electrical communications signals 1028U(1)-1028U(X) into uplink optical communications signals 1012U(1)-1012U(X). The remote sub-units distribute the uplink optical communications signals 1012U(1)-1012U(X) over an uplink optical fiber communications link 1014U to the OIMs 1010(1)-1010(W) in the central unit 1006. The O-E converters 1024(1)-1024(W) convert the received uplink optical communications signals 1012U(1)-1012U(X) into uplink electrical communications signals 1030U(1)-1030U(X), which are processed by the RIMs 1004(1)-1004(T) and provided as the uplink electrical communications signals 1030U(1)-1030U(X) to a source transceiver such as a BTS or BBU.

Note that the downlink optical fiber communications link 1014D and the uplink optical fiber communications link 1014U coupled between the central unit 1006 and the remote sub-units may be a common optical fiber communications link, wherein for example, wave division multiplexing (WDM) may be employed to carry the downlink optical communications signals 1012D(1)-1012D(S) and the uplink optical communications signals 1012U(1)-1012U(X) on the same optical fiber communications link. Alternatively, the downlink optical fiber communications link 1014D and the uplink optical fiber communications link 1014U coupled between the central unit 1006 and the remote sub-units may be single, separate optical fiber communications links, wherein for example, wave division multiplexing (WDM) may be employed to carry the downlink optical communications signals 1012D(1)-1012D(S) on one common downlink optical fiber and the uplink optical communications signals 1012U(1)-1012U(X) on a separate, only uplink optical fiber. Alternatively, the downlink optical fiber communications link 1014D and the uplink optical fiber communications link 1014U coupled between the central unit 1006 and the remote sub-units may be separate optical fibers dedicated to and providing a separate communications link between the central unit 1006 and each remote sub-unit.

Figure 11:
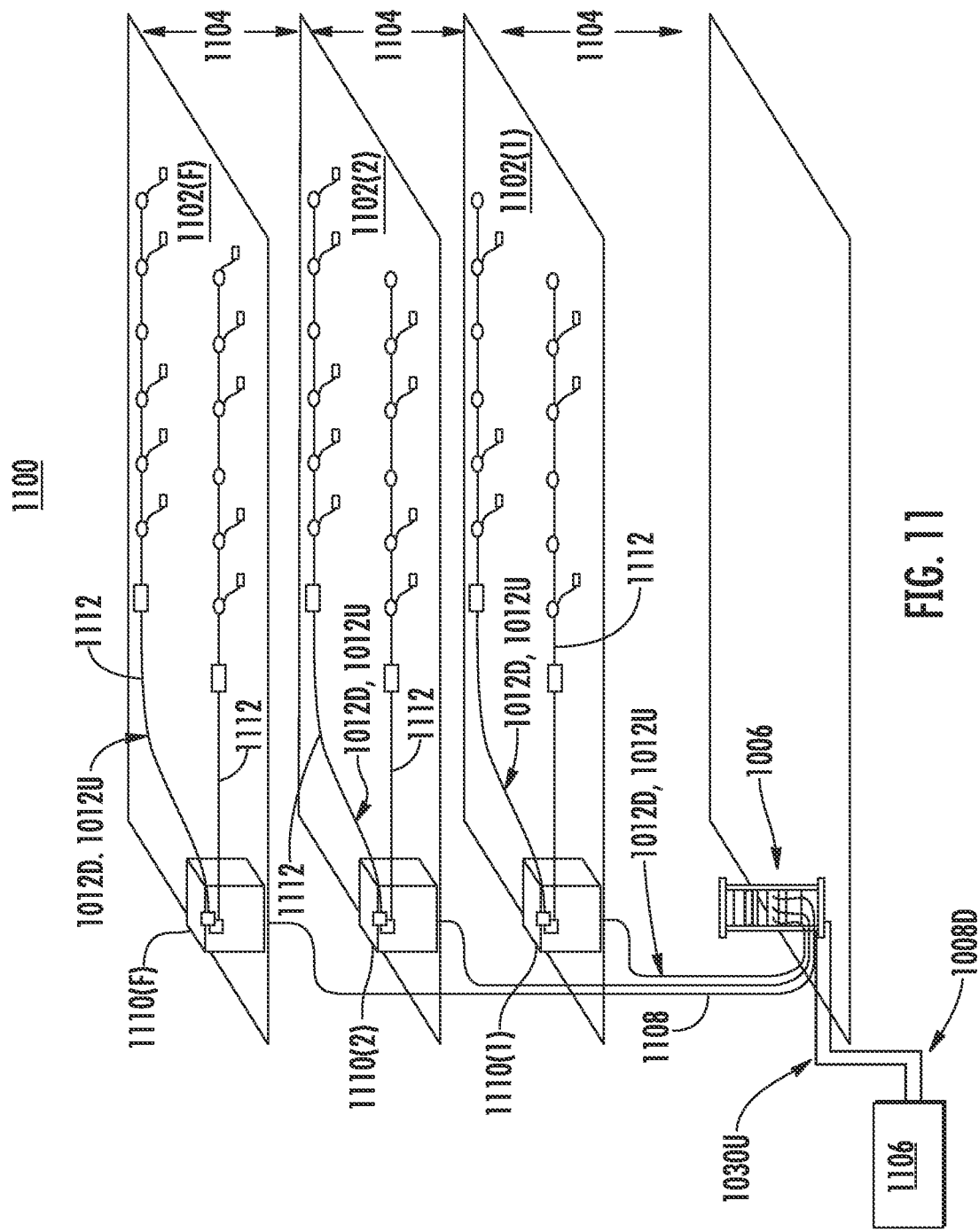
FIG. 11 is a partially schematic cut-away diagram of an exemplary building infrastructure in which the DCS in FIG. 10 can be provided.

The DAS 1000 and its PDN 500 or 900 can be provided in an indoor environment as illustrated in FIG. 11. FIG. 11 is a partially schematic cut-away diagram of a building infrastructure 1100 employing the PDN 500 of FIG. 5 or the PDN 900 of FIG. 9. The building infrastructure 1100 in this embodiment includes a first (ground) floor 1102(1), a second floor 1102(2), and an Fth floor 1102(F), where 'F' can represent any number of floors. The floors 1102(1)-1102(F) are serviced by the central unit 1006 to provide antenna coverage areas 1104 in the building infrastructure 1100. The central unit 1006 is communicatively coupled to a signal source 1106, such as a BTS or BBU, to receive the downlink electrical communications signals 1008D(1)-1008D(S). The central unit 1006 is communicatively coupled to the remote sub-units to receive uplink optical communications signals 1012U(1)-1012U(X) from the remote sub-units as previously described in FIG. 10. The downlink and uplink optical communications signals 1012D(1)-1012D(S), 1012U(1)-1012U(X) are distributed between the central unit 1006 and the remote sub-units over a riser cable 1108 in this example. The riser cable 1108 may be routed through interconnect units (ICUs) 1110(1)-1110(F) dedicated to each floor 1102(1)-1102(F) for routing the downlink and uplink optical communications signals 1012D(1)-1012D(S), 1012U(1)-1012U(X) to the remote sub-units. The ICUs 1110(1)-1110(F) may also include respective power distribution circuits that include power sources as part of the PDN 500, 900, wherein the power distribution circuits are configured to distribute power remotely to the remote sub-units to provide power for operating the power-consuming components in the remote sub-units. For example, array cables 1112 may be provided and coupled between the ICUs 1110(1)-1110(F) that contain both optical fibers to provide the respective downlink and uplink optical fiber communications media 1014D(1)-1014D(2F), 1014U(1)-1014U(2F) and power conductors (e.g., electrical wire) to carry current from the respective power distribution circuits to the remote sub-units.

Figure 12:
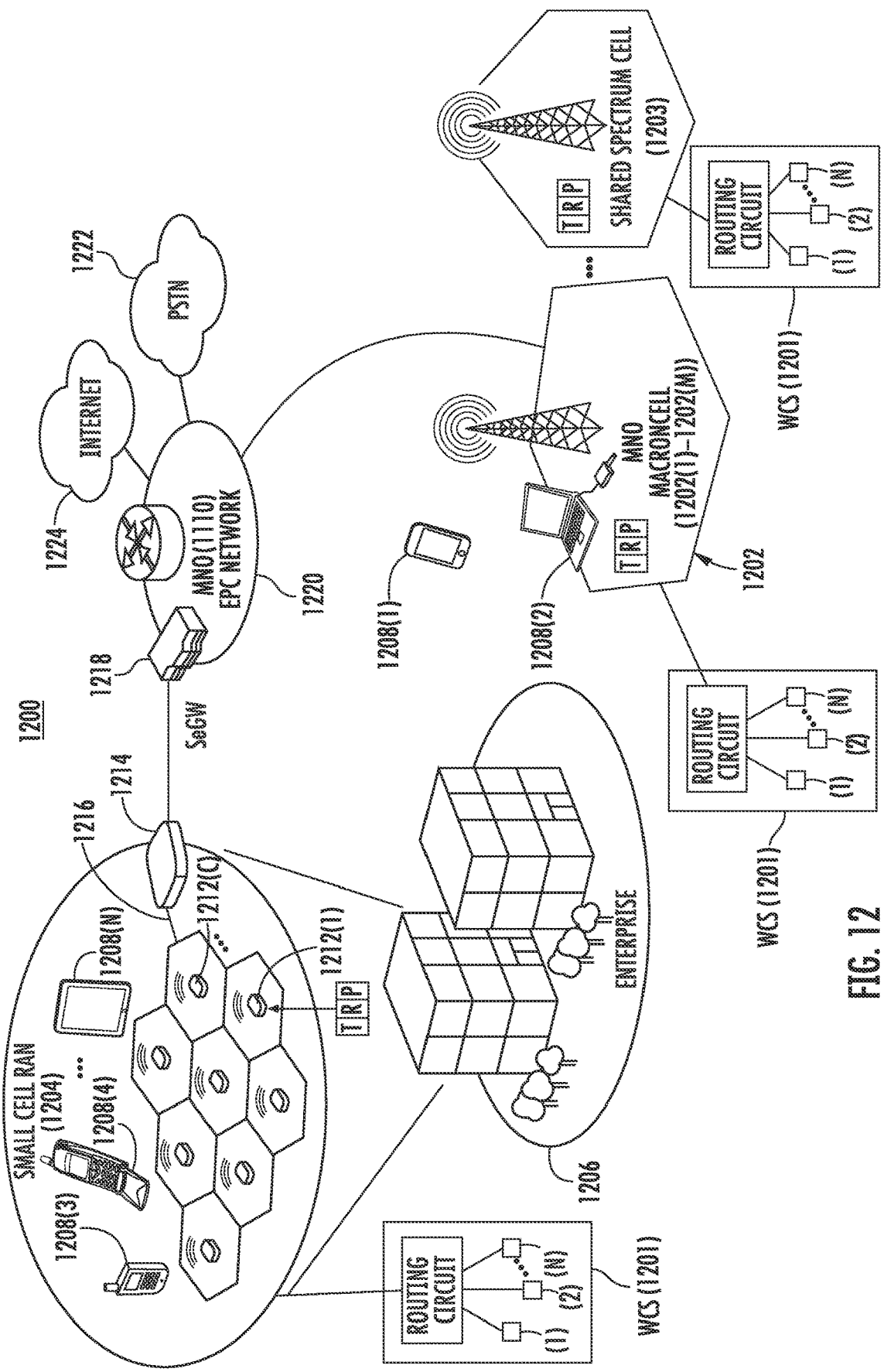
FIG. 12 is a schematic diagram of an exemplary mobile telecommunications environment that includes an exemplary radio access network (RAN) that includes a mobile network operator (MNO) macrocell employing a radio node, a shared spectrum cell employing a radio node, an exemplary small cell RAN employing a multi-operator radio node located within an enterprise environment as DCSs, and that can include one or more PDNs, including the PDNs in FIG. 5 or 9.

FIG. 12 is a schematic diagram of an exemplary mobile telecommunications environment 1200 that includes an exemplary radio access network (RAN) that includes a mobile network operator (MNO) macrocell employing a radio node, a shared spectrum cell employing a radio node, an exemplary small cell RAN employing a multi-operator radio node located within an enterprise environment as DCSs, and that can include one or more PDN. The environment 1200 includes exemplary macrocell RANs 1202(1)-1202(M) ("macrocells 1202(1)-1202(M)") and an exemplary small cell RAN 1204 located within an enterprise environment 1206 and configured to service mobile communications between a user mobile communications device 1208(1)-1208(N) to an MNO 1210. A serving RAN for a user mobile communications device 1208(1)-1208(N) is a RAN or cell in the RAN in which the user mobile communications devices 1208(1)-1208(N) have an established communications session with the exchange of mobile communications signals for mobile communications. Thus, a serving RAN may also be referred to herein as a serving cell. For example, the user mobile communications devices 1208(3)-1208(N) in FIG. 12 are being serviced by the small cell RAN 1204, whereas user mobile communications devices 1208(1) and 1208(2) are being serviced by the macrocell 1202. The macrocell 1202 is an MNO macrocell in this example. However, a shared spectrum RAN 1203 (also referred to as "shared spectrum cell 1203") includes a macrocell in this example and supports communications on frequencies that are not solely licensed to a particular MNO and thus may service user mobile communications devices 1208(1)-1208(N) independent of a particular MNO. For example, the shared spectrum cell 1203 may be operated by a third party that is not an MNO and wherein the shared spectrum cell 1203 supports Citizen Broadband Radio Service (CBRS). Also, as shown in FIG. 12, the MNO macrocell 1202, the shared spectrum cell 1203, and/or the small cell RAN 1204 can interface with a shared spectrum DCS 1201 supporting coordination of distribution of shared spectrum from multiple service providers to remote sub-units to be distributed to subscriber devices. The MNO macrocell 1202, the shared spectrum cell 1203, and the small cell RAN 1204 may be neighboring radio access systems to each other, meaning that some or all can be in proximity to each other such that a user mobile communications device 1208(1)-1208(N) may be able to be in communications range of two or more of the MNO macrocell 1202, the shared spectrum cell 1203, and the small cell RAN 1204 depending on the location of user mobile communications devices 1208(1)-1208(N).

In FIG. 12, the mobile telecommunications environment 1200 in this example is arranged as an LTE (Long Term Evolution) system as described by the Third Generation Partnership Project (3GPP) as an evolution of the GSM/UMTS standards (Global System for Mobile communication/Universal Mobile Telecommunications System). It is emphasized, however, that the aspects described herein may also be applicable to other network types and protocols. The mobile telecommunications environment 1200 includes the enterprise environment 1206 in which the small cell RAN 1204 is implemented. The small cell RAN 1204 includes a plurality of small cell radio nodes 1212(1)-1212(C). Each small cell radio node 1212(1)-1212(C) has a radio coverage area (graphically depicted in the drawings as a hexagonal shape) that is commonly termed a "small cell." A small cell may also be referred to as a femtocell or, using terminology defined by 3GPP, as a Home Evolved Node B (HeNB). In the description that follows, the term "cell" typically means the combination of a radio node and its radio coverage area unless otherwise indicated.

In FIG. 12, the small cell RAN 1204 includes one or more services nodes (represented as a single services node 1214) that manage and control the small cell radio nodes 1212(1)-1212(C). In alternative implementations, the management and control functionality may be incorporated into a radio node, distributed among nodes, or implemented remotely (i.e., using infrastructure external to the small cell RAN 1204). The small cell radio nodes 1212(1)-1212(C) are coupled to the services node 1214 over a direct or local area network (LAN) connection 1216 as an example, typically using secure IPsec tunnels. The small cell radio nodes 1212(1)-1212(C) can include multi-operator radio nodes. The services node 1214 aggregates voice and data traffic from the small cell radio nodes 1212(1)-1212(C) and provides connectivity over an IPsec tunnel to a security gateway (SeGW) 1218 in a network 1220 (e.g., evolved packet core (EPC) network in a 4G network, or 5G Core in a 5G network) of the MNO 1210. The network 1220 is typically configured to communicate with a public switched telephone network (PSTN) 1222 to carry circuit-switched traffic, as well as for communicating with an external packet-switched network such as the Internet 1224.

The environment 1200 also generally includes a node (e.g., eNodeB or gNodeB) base station, or "macrocell" 1202. The radio coverage area of the macrocell 1202 is typically much larger than that of a small cell where the extent of coverage often depends on the base station configuration and surrounding geography. Thus, a given user mobile communications device 1208(1)-1208(N) may achieve connectivity to the network 1220 (e.g., EPC network in a 4G network, or 5G Core in a 5G network) through either a macrocell 1202 or small cell radio node 1212(1)-1212(C) in the small cell RAN 1204 in the environment 1200.

FIG. 13 is a schematic diagram illustrating exemplary DCSs 1300 that support 4G and 5G communications services. The DCSs 1300 in FIG. 13 can include one or more PDNs. The DCSs 1300 support both legacy 4G LTE, 4G/5G non-standalone (NSA), and 5G communications systems. As shown in FIG. 13, a centralized services node 1302 is provided that is configured to interface with a core network to exchange communications data and distribute the communications data as radio signals to remote sub-units. In this example, the centralized services node 1302 is configured to support distributed communications services to a millimeter wave (mmW) radio node 1304. The functions of the centralized services node 1302 can be virtualized through an x2 interface 1306 to another services node 1308. The centralized services node 1302 can also include one or more internal radio nodes that are configured to be interfaced with a distribution node 1310 to distribute communications signals for the radio nodes to an open RAN (O-RAN) remote unit 1312 that is configured to be communicatively coupled through an O-RAN interface 1314.

The centralized services node 1302 can also be interfaced through an x2 interface 1316 to a BBU 1318 that can provide a digital signal source to the centralized services node 1302. The BBU 1318 is configured to provide a signal source to the centralized services node 1302 to provide radio source signals 1320 to the O-RAN remote unit 1312 as well as to a distributed router unit (DRU) 1322 as part of a digital DAS. The DRU 1322 is configured to split and distribute the radio source signals 1320 to different types of remote sub-units, including a lower-power remote unit (LPR) 1324, a radio antenna unit (dRAU) 1326, a mid-power remote unit (dMRU) 1328, and a high-power remote unit (dHRU) 1330. The BBU 1318 is also configured to interface with a third party central unit 1332 and/or an analog source 1334 through a radio frequency (RF)/digital converter 1336.

FIG. 14 is a schematic diagram representation of additional detail illustrating a computer system 1400 that could be employed in any component or circuit in a PDN. In this regard, the computer system 1400 is adapted to execute instructions from an exemplary computer-readable medium to perform these and/or any of the functions or processing described herein. The computer system 1400 in FIG. 14 may include a set of instructions that may be executed to program and configure programmable digital signal processing circuits in a DCS for supporting scaling of supported communications services. The computer system 1400 may be connected (e.g., networked) to other machines in a LAN, an intranet, an extranet, or the Internet. While only a single device is illustrated, the term "device" shall also be taken to include any collection of devices that individually or jointly execute a set (or multiple sets) of instructions to perform any one or more of the methodologies discussed herein. The computer system 1400 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer.

The exemplary computer system 1400 in this embodiment includes a processing circuit or processor 1402, a main memory 1404 (e.g., read-only memory (ROM), flash memory, dynamic random access memory (DRAM), such as synchronous DRAM (SDRAM), etc.), and a static memory 1406 (e.g., flash memory, static random access memory (SRAM), etc.), which may communicate with each other via a data bus 1408. Alternatively, the processor 1402 may be connected to the main memory 1404 and/or static memory 1406 directly or via some other connectivity means. The processor 1402 may be a controller, and the main memory 1404 or static memory 1406 may be any type of memory.

The processor 1402 represents one or more general-purpose processing devices, such as a microprocessor, central processing unit, or the like. More particularly, the processor 1402 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 1402 is configured to execute processing logic in instructions for performing the operations and steps discussed herein.

The computer system 1400 may further include a network interface device 1410. The computer system 1400 also may or may not include an input 1412, configured to receive input and selections to be communicated to the computer system 1400 when executing instructions. The computer system 1400 also may or may not include an output 1414, including, but not limited to, a display, a video display unit (e.g., a liquid crystal display (LCD) or a cathode ray tube (CRT)), an alphanumeric input device (e.g., a keyboard), and/or a cursor control device (e.g., a mouse).

The computer system 1400 may or may not include a data storage device that includes instructions 1416 stored in a computer-readable medium 1418. The instructions 1416 may also reside, completely or at least partially, within the main memory 1404 and/or within the processor 1402 during execution thereof by the computer system 1400, the main memory 1404 and the processor 1402 also constituting computer-readable medium. The instructions 1416 may further be transmitted or received over a network 1420 via the network interface device 1410.

While the computer-readable medium 1418 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be performed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., read only memory ("ROM"), random access memory ("RAM"), magnetic disk storage medium, optical storage medium, flash memory devices, etc.), a machine-readable transmission medium (electrical, optical, acoustical or other form of propagated signals (e.g., carrier waves, infrared signals, digital signals, etc.)), etc.

Unless specifically stated otherwise as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information may be represented using any of a variety of different technologies and techniques. For example, data, instructions, commands, information, bits, symbols, and chips that may be referenced throughout the above description may be represented by voltages, currents, electromagnetic waves, magnetic fields or particles, optical fields or particles, or any combination thereof.

Further, as used herein, it is intended that terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like. The optical fibers disclosed herein can be single mode or multi-mode optical fibers. Likewise, other types of suitable optical fibers include bend-insensitive optical fibers, or any other expedient of a medium for transmitting light signals. An example of a bend-insensitive, or bend resistant, optical fiber is ClearCurve® Multimode fiber commercially available from Corning Incorporated. Suitable fibers of this type are disclosed, for example, in U.S. Patent Application Publication Nos. 2008/0166094 and 2009/0169163, the disclosures of which are incorporated herein by reference in their entireties.

Many modifications and other embodiments of the embodiments set forth herein will come to mind to one skilled in the art to which the embodiments pertain having the benefit of the teachings presented in the foregoing descriptions and the associated drawings. For example, the antenna arrangements may include any type of antenna desired, including but not limited to dipole, monopole, and slot antennas. The distributed antenna systems that employ the antenna arrangements disclosed herein could include any type or number of communications mediums, including but not limited to electrical conductors, optical fiber, and air (i.e., wireless transmission). The distributed antenna systems may distribute and the antenna arrangements disclosed herein may be configured to transmit and receive any type of communications signals, including but not limited to RF communications signals and digital data communications signals, examples of which are described in U.S. patent application Ser. No. 12/892,424 entitled "Providing Digital Data Services in Optical Fiber-based Distributed Radio Frequency (RF) Communications Systems, And Related Components and Methods," published as U.S. Patent Application Publication No. 2011/0268446, incorporated herein by reference in its entirety. Multiplexing, such as WDM and/or FDM, may be employed in any of the distributed antenna systems described herein, such as according to the examples provided in U.S. patent application Ser. No. 12/892,424.

Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

What is claimed is:
1. A power source unit (PSU) comprising:
a cabinet;
a powering supply;
a flexible cable coupled to the powering supply, the flexible cable positioned completely within the cabinet;
a printed circuit board (PCB) coupled to the flexible cable such that the flexible cable may carry power from the powering supply to the PCB, wherein the powering supply and the PCB are positioned within the cabinet;
a metal bar coupled to the PCB, the metal bar configured to convey power from the flexible cable to elements on the PCB; and
a power output port positioned on the PCB and accessible at an exterior surface of the cabinet.

2. The PSU of claim 1, wherein the powering supply comprises a metal tongue, the flexible cable attached to the metal tongue.

3. The PSU of claim 2, wherein the flexible cable comprises a second tongue configured to abut the metal tongue when the flexible cable is attached to the metal tongue.

4. The PSU of claim 2, further comprising a bolt attaching the flexible cable to the metal tongue.

5. The PSU of claim 1, wherein the metal bar comprises a plurality of apertures.

6. The PSU of claim 5, wherein the metal bar is attached to the PCB by a fastener passing through at least one of the plurality of apertures.

7. The PSU of claim 5, wherein the flexible cable is attached to the metal bar by a fastener passing through at least one of the plurality of apertures.

8. The PSU of claim 1, wherein the flexible cable comprises a metal mesh.

9. The PSU of claim 8, wherein the flexible cable further comprises an insulative sheath surrounding a portion of the metal mesh.

10. The PSU of claim 8, wherein the flexible cable further comprises two metal tongues, one at each end of the metal mesh.

11. The PSU of claim 10, wherein at least one metal tongue defines an aperture configured to allow a fastener to pass at least partially therethrough.

12. The PSU of claim 8, wherein the metal mesh comprises a cross-sectional area of 16 square millimeters ($mm^2$).

13. A distributed communication system (DCS), comprising:
a power distribution network (PDN), comprising:
a power source unit (PSU) comprising:
a cabinet;
a powering supply;
a flexible cable coupled to the powering supply, the flexible cable positioned completely within the cabinet;
a printed circuit board (PCB) coupled to the flexible cable such that the flexible cable may carry power from the powering supply to the PCB; and
a metal bar coupled to the PCB, the metal bar configured to convey power from the flexible cable to elements on the PCB;
a plurality of remote sub-units, each remote sub-unit comprising:

a remote sub-unit power input port coupled to the PSU; and a central unit configured to:
- distribute received one or more downlink communications signals over one or more downlink communications links to one or more remote sub-units; and
- distribute received one or more uplink communications signals from the one or more remote sub-units from one or more uplink communications links to one or more source communications outputs;

each remote sub-unit among the plurality of remote sub-units configured to:
- distribute the received one or more downlink communications signals received from the one or more downlink communications links to one or more client devices; and
- distribute the received one or more uplink communications signals from the one or more client devices to the one or more uplink communications links.

14. The DCS of claim 13, wherein the central unit is configured to:
- distribute each of the received one or more downlink communications signals over a distribution communications output among a plurality of distribution communications outputs to a downlink communications link among the one or more downlink communications links; and
- distribute each of the received one or more uplink communications signals from an uplink communications link among the one or more uplink communications links on a distribution communications input among a plurality of distribution communications inputs to the one or more source communications outputs.

15. The DCS of claim 13, comprising a distributed antenna system (DAS).

16. The DCS of claim 13, wherein:
the one or more downlink communications links comprise one or more optical downlink communications links;
the one or more uplink communications links comprise one or more optical uplink communications links;
the central unit further comprises:
- one or more electrical-to-optical (E-O) converters configured to convert received one or more electrical downlink communications signals into one or more optical downlink communications signals; and
- one or more optical-to-electrical (O-E) converters configured to convert received one or more optical uplink communications signals into one or more electrical uplink communications signals;

the central unit is further configured to:
- distribute the one or more optical downlink communications signals from the one or more E-O converters over a plurality of optical distribution communications outputs to the one or more optical downlink communications links; and
- distribute the received one or more optical uplink communications signals from the one or more optical uplink communications links on a plurality of optical distribution communications inputs to the one or more O-E converters;

each remote unit among the plurality of remote sub-units further comprises:
- one or more O-E converters configured to convert the received one or more optical downlink communications signals into one or more electrical downlink communications signals;
- one or more E-O converters configured to convert the received one or more electrical uplink communications signals into one or more optical uplink communications signals; and each remote unit among the plurality of remote sub-units is configured to:
- distribute the one or more electrical downlink communications signals from the one or more O-E converters to the one or more client devices; and
- distribute the one or more optical uplink communications signals from the one or more E-O converters to the one or more optical downlink communications links.

* * * * *